United States Patent [19]

Moriwaki et al.

[11] Patent Number: 5,025,422
[45] Date of Patent: Jun. 18, 1991

[54] SEMICONDUCTOR MEMORY DEVICE

[75] Inventors: Nobuyuki Moriwaki, Kodaira; Mitsuhiro Higuchi, Koganei; Mitsuhiro Toshita, Kodaira, all of Japan

[73] Assignees: Hitachi, Ltd.; Hitachi VLSI Engineering Corp., both of Tokyo, Japan

[21] Appl. No.: 419,311

[22] Filed: Oct. 10, 1989

[30] Foreign Application Priority Data

Oct. 7, 1988 [JP] Japan .................. 63-253147

[51] Int. Cl.$^5$ .............................................. G11C 7/00
[52] U.S. Cl. ............................ 365/233.5; 365/189.11; 365/201
[58] Field of Search ............. 365/189.11, 230.06, 365/233, 233.5, 201, 227

[56] References Cited

U.S. PATENT DOCUMENTS 4,272,832 6/1981 Ito ................................. 365/233.5
4,633,442 12/1986 Borghese ..................... 365/233.5

Primary Examiner—Joseph A. Popek
Attorney, Agent, or Firm—Antonelli, Terry, Stout & Kraus

[57] ABSTRACT

A static random access memory device is provided with an internal activation signal generator and circuit means for overriding application of the internal activation signals to the memory circuit under predetermined circumstances. In normal read/write operation modes, word lines and a sense amplifier are activated only during a predetermined period in response to the internal activation signals in order to reduce power consumption. On the other hand, in a test mode, since the circuit means detects a higher voltage level of a predetermined external terminal of the device, the internal activation signals from the pulse generator are not used to limit the operating time of the word lines and sense amplifier. Therefore, during the test mode, the word lines and the sense amplifier are activated for a longer period than during the normal read/write operation mode. Because of this, the device is able to shorten aging time which occurs in the test mode.

24 Claims, 5 Drawing Sheets

SEMICONDUCTOR MEMORY DEVICE

FIELD OF THE INVENTION

This invention relates to a semiconductor memory device and particularly to an improved static RAM (Random Access Memory) of the automatic power-down system type.

BACKGROUND OF THE INVENTION

Recently static RAMs employing an automatic power-down system have been developed which make word lines and sense amplifiers inoperative after completion of a series of read operations by use of an address signal change detection signal. Examples of such static RAMs include devices "HM62256, HM628128" marketed by Hitachi, Ltd.

The automatic power-down system described above makes word lines and sense amplifiers inoperative at the time of completion of a data read operation even if a chip select signal CS or the like is under the low level active state, and thereby reduces current consumption. However, since the automatic power-down function operates even in an acceleration test such as aging, the actual operation time of an internal circuit becomes shorter than the test cycle of the acceleration test. This results in the problem that the time necessary for the acceleration test becomes extended.

It is an object of the present invention to provide a static RAM which can shorten the test time of such an acceleration test while still accomplishing the low power consumption advantages of an automatic power-down system in an ordinary operation mode.

The abov and other objects and novel features of the present invention will become more apparent from the following detailed description in conjunction with the accompanying drawings.

SUMMARY OF THE INVENTION

Among the inventions disclosed in this application, the following will illustrate briefly a typical example. Namely, the present invention provides the function of effectively invalidating an internal activation pulse formed in the automatic power-down system o the basis of an address signal change detection pulse in a predetermined test operation mode.

According to the means described above, the internal activation pulse is effectively invalidated by the function described above so that word lines and sense amplifiers are activated in a longer period of time. Therefore, the acceleration test time such as aging can be shortened.

DETAILED DESCRIPTION

Figure 1:
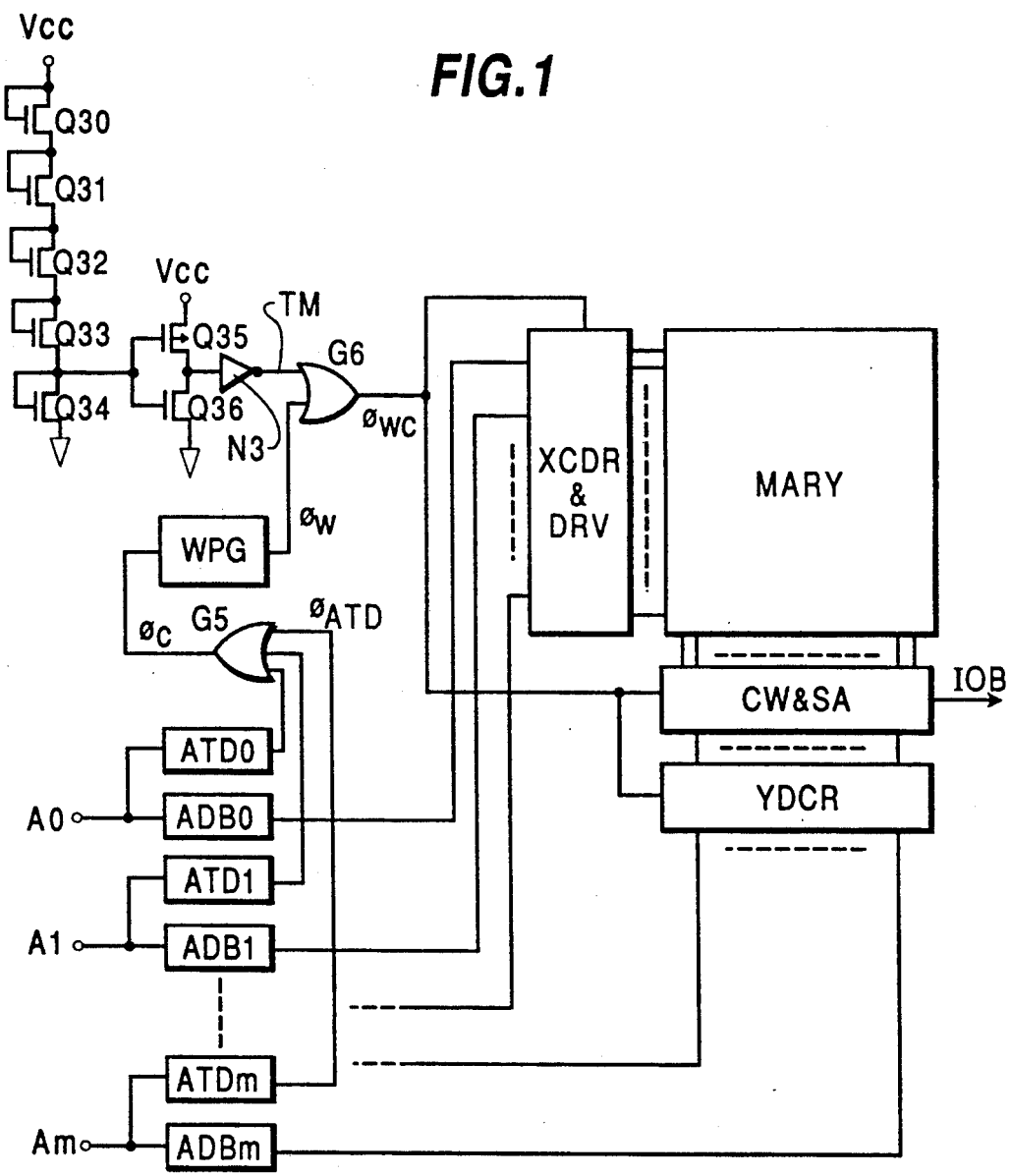
FIG. 1 is a block diagram showing a static RAM in accordance with one embodiment of the present invention.

FIG. 1 is a block diagram of a static RAM in accordance with one embodiment of the present invention. The RAM shown in the drawing is formed on a semiconductor substrate such as a single crystal silicon by known CMOS integration circuit technology.

Though not particularly limited thereto, the integrated circuit is formed on a semiconductor substrate made of a single crystal N-type silicon. P-channel MOSFETs of the static RAM each include a source region and a drain region that are formed on the surface of the semiconductor substrate and a gate electrode made of polysilicon and formed on the surface of the semiconductor substrate between a source region and the drain region through a thin gate insulating film. N-channel MOSFETs of the static RAM each are formed in a P-type well region which is formed on the semiconductor substrate surface. The semiconductor substrate constitutes a common substrate gate for a plurality of P-channel MOSFET formed thereon. The P-type well region constitutes a substrate gate for the N-channel MOSFET formed thereon.

In the drawing, a P-channel MOSFET is distinguished from an N-channel MOSFET by an arrow pointing to its channel (back-gate) portion. This also holds true of later-appearing FIGS. 2, 5 and 7.

As will be described later in further detail, a memory array MARY is formed by disposing static memory cells in matrix form at the points of intersection between a plurality of word lines and a plurality of complementary data lines.

Address signals A0-Am supplied from external terminals are supplied to address buffers ADB0-ADBm on one hand and to address signal change detection circuits ATD0-ATDm, on the other. The internal address signals formed by the address buffers ADB0, ADB1, etc., receiving the X address signals among the address buffers are supplied to an X decoder XDCR. The X decoder decodes the X address signals and generates a select signal for selecting one word line from a plurality of word lines of the memor array MARY. This select signal is transferred to the corresponding word line through a driving circuit DRV. In the drawing, the X decoder XDCR and the driving circuit DRV are shown as one circuit block for purposes of drawing simplification. In this embodiment, during normal operation the X decoder XDCR outputs the select signal only for a predetermined period in accordance with an internal activation pulse in order to attain low power consumption, as will be discussed later.

The internal address signal formed by the address buffer ADBm, etc., receiving the Y address signals among the address buffers described above, is supplied to a Y decoder YDCR. The Y decoder YDCR decodes the Y address signals and generates a select signal for selecting a pair of complementary data lines from a plurality of complementary data lines of the memory array MARY. This select signal is transferred to a column switch. The column switch CW connects the selected complementary data lines to the common complementary data lines. A sense amplifier is coupled to the common complementary data lines. In the drawing, the column switch CW and the sense amplifier SA are shown as one circuit block for purposes of drawing simplification. In this embodiment, during normal operation, the Y decoder YDCR and the sense amplifier SA output the select signal only for a predetermined period in accordance with an internal activation pulse and exhibit the sense operation, respectively, in order to attain low power consumption, as will be discussed later.

The address signal change detection circuit ATD0 consists of an exclusive-OR circuit, not shown, for receiving the address signal and a delay signal thereof, and for generating an address signal change detection pulse $\phi_{ATD}$ in accordance with the change of the address signal AO from the high level to the low level or from the low level to the high level. Each of the other address signal change detection circuits ATD1, etc., operates in this same manner with regard to the address signal it receives. The address signal change detection pulse $\phi_{ATD}$ generated so as to correspond to each address signal A0–Am is supplied to an OR gate circuit G5. If even one bit of any address changes as described above from among a plurality of address signals A0 through Am, the OR gate circuit G5 outputs the address signal change detection output pulse $\phi_c$ in accordance with its change timing. This detection output pulse $\phi_c$ is supplied to the internal activation pulse generation circuit WPG. This internal activation pulse generation circuit WPG performs a pulse width extension operation and generates the internal activation pulse $\phi_w$ having a pulse width which is matched with the time necessary for the read operation of the memory cell.

In this embodiment the internal activation pulse $\phi_w$ itself is not supplied directly to the decoders XDCR and YDCR, but instead is supplied through the OR gate circuit G6. In other words, during normal operation the output pulse $\phi_{wc}$ of the OR gate circuit G6 substantially corresponds to internal activation pulse $\phi_w$. However, as will be discussed later, this is not the case during a test operation.

A gate control operation of the OR gate circuit G6 is accomplished by the output signal TM of a high voltage detection circuit which will now be discussed. The high voltage detection circuit can be formed with the following circuits. Series MOSFETs Q30–Q34 disposed between the power source voltage $V_{cc}$ and the ground potential point of the circuit constitute a level shift circuit for shifting the level of the power source voltage $V_{cc}$. In other words, MOSFETs Q30 through Q34 described above have a diode structure wherein their gates and their drains are connected. When the power source voltage $V_{cc}$ exceeds the combined threshold voltage of MOSFETs Q30 through Q34, a voltage which is a divided voltage of the power source voltage in proportion to the ratio of the combined conductance of MOSFETs Q30 through Q34 to the conductance of MOSFET Q34 is outputted from the junction between MOSFETs Q33 and Q34. As an example, the threshold voltages for Q30 to Q34 can be such that a power source voltage $V_{cc}$ is below the combined threshold voltage of MOSFETs Q30 through Q34 within the range of 5 V±10% whereby D.C. current will be prevented from flowing through the series MOSFETs Q30 through Q34. On the other hand, when the power source voltage $V_{cc}$ is set to a relatively high voltage about 8 V, for example, MOSFETs Q30 through Q34 are ON and the ratio of conductance of MOSFETs Q30 through Q34 to the conductance of MOSFETs Q35 and Q36 forming an inverter circuit is set so that the divided voltage described above is above the threshold voltage of a CMOS inverter circuit consisting of P-channel MOSFET Q35 and N-channel MOSFET Q36 serving as a voltage comparison circuit.

The output signal of the CMOS inverter circuit consisting of MOSFETs Q35 and Q36 described above is made the control signal TM for controlling the OR gate circuit G6 through a similar CMOS inverter circuit N3.

Figure 2:
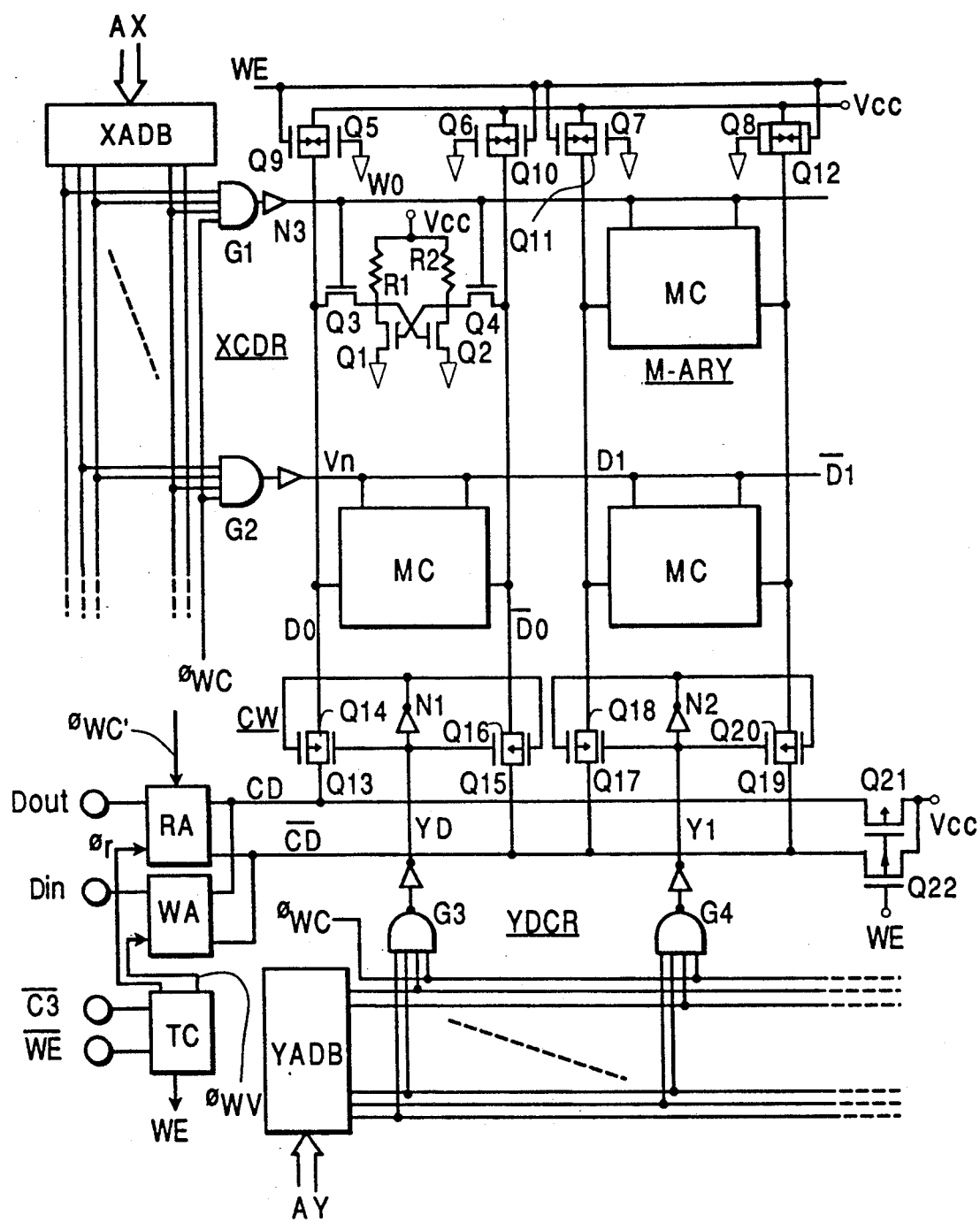
FIG. 2 is a circuit diagram of one definite example of the memory array MARY and peripheral circuits of the static RAM of FIG. 1.

FIG. 2 shows a more detailed circuit diagram of the memory array MARY described above and peripheral circuitry that can be used in conjunction with it.

The memory array MARY is formed of a plurality of memory cells disposed in matrix form, word lines W0 through Wn and complementary data lines D0, $\overline{D0}$ through D1, $\overline{D1}$. Each of the memory cells MC has the same structure. As can be seen from a definite circuit example shown in the drawing, this structure includes N-channel memory MOSFETs Q1 and Q2 whose gates and drains are mutually cross-coupled and whose sources are connected to the ground point of the circuit, and high resistance value resistors R1 and R2 disposed between the drains of MOSPETs Q1, Q2 and the power source terminal $V_{cc}$ and made of a poly (polycrystalline) silicon layer. N-channel transfer gate MOSFETs Q3 and Q4 are disposed between the common junction of MOSFETs Q1, Q2 and the complementary data lines D0, $\overline{D0}$, respectively. The gates of the transfer gate MOSFETs Q3, Q4, etc., of the memory cells disposed on the same row are commonly connected to the corresponding word lines W0–Wn shown typically, and the input/output terminals of the memory cells disposed on the same column are connected to a pair of complementary data lines (bit line or digit line) D0, $\overline{D0}$ shown typically.

In each memory cell, MOSFETs Q1, Q2 and the resistors R1, R2 constitute a kind of flip-flop circuit, but its operation point in the data latch state is somewhat different from that of the flip-flop circuit in the ordinary sense of the term. In other words, in the memory cell MC described above, the resistance value of its resistor R1 is set to an extremely high resistance value so as to keep the gate voltage of MOSFET Q2 at a voltage which is considerably higher than its threshold voltage when MOSFET Q1 is OFF, in order to reduce power consumption of the memory cell. Similarly, the value of the resistor R2 is set to a high resistance value. In other words, the resistors R1 and R2 have a high resistance value so that they can compensate for the drain leakage current of MOSPETs Q1, Q2. The resistors R1, R2 have a current supply capacity to such an extent as to prevent the data charge stored in the gate capacitance (not shown) of MOSFET Q2 from being discharged.

In accordance with this embodiment, though the RAM is fabricated by the CMOS-IC technique, the memory cell MC is composed of the N-channel MOSFET and polysilicon resistance elements as described above.

The memory cell and the memory array in this embodiment ca reduce the size in comparison with the case where a n P-channel MOSFET is used in place of the polysilicon resistance element described above. In other words, when the polysilicon resistor is used, it can be formed on the gate electrode of a driving MOSFET Q1 or Q2 and its own size can be reduced. Since there is no necessity of spacing P-channel MOSFETs from the driving MOSFETs Q1, Q2 with a relatively large distance such as when the P-channel MOSFET is used, a waste space portion does not occur in this embodiment.

P-channel load MOSFETs Q5 through Q8, which operate as the resistance elements when the ground potential of the circuit is steadily applied to their gates, are disposed between the complementary data lines D0, $\overline{D0}$, D1, $\overline{D1}$ and the power source voltage $V_{cc}$ in the drawing, although the invention is not particularly limited to this. Since the size of each MOSFET Q5–Q8 is relatively reduced, each transistor has a small conductance. P-channel load MOSFETs Q9 through Q12 are disposed in parallel with these load MOSFETs Q5 through Q8. Since the size of these load MOSFETs Q9–Q12 is relatively great, each transistor has a relatively large conductance. The ratio of combined conductance of MOSFETs Q5–Q8 when MOSFETs Q9–Q12 are ON to the combined conductance of the transfer gate MOSFET and memory MOSFET of the memory cell MC is set so that the complementary data lines D0, $\overline{D0}$, D1, $\overline{D1}$ have a desired potential difference in accordance with their memory data in the read operation of the memory cell MC. An internal write signal WE which is set to a high level such as the power source voltage $V_{cc}$ at the time of the write operation is supplied to the gate of each load MOSFET Q9–Q12. Therefore, each load MOSFET Q9–Q12 is OFF at the time of the write operation, and the load means in the complementary data lines in the write operation is only MOSFET Q5–Q8 having the small conductance.

In the drawing, the word line W0 is selected by the X decoder XDCR and the driving circuit DRV as described above.

The X address decoder XDCR can be formed of mutually similar NAND gates G1, G2, etc. Internal complementary address signals generated by an address buffer XADB for receiving X external address signals AX consisting of a plurality of bits are applied in a predetermined combination to the input terminals of these NAND gate circuits G1, G2, etc. The internal activation pulse $\phi_{wc}$ outputted through the OR gate circuit G6 is commonly supplied to these NAND gate circuits G1, G2, etc.

A CMOS switch circuit consisting of a parallel circuit of N-channel MOSFET Q13 and P-channel MOSFET Q14 is disposed between the complementary data line D0 and the common complementary data line CD in the memory array described above. The other data lines $\overline{D0}$, D1, $\overline{D1}$, etc., are connected to the corresponding common complementary data lines CD, $\overline{CD}$ by similar CMOS switch circuits. These CMOS switch circuits together form a column switch CW.

The select signals Y0, Y1 generated by the Y address decoder YDCR are supplied to the gates of the N-channel MOSFETs Q13, Q15 and Q17, Q19 forming the column switch CW. The output signals of CMOS inverter circuits N1, N2 for receiving the select signals Y0, Y1 described above are supplied to the gates of the P-channel MOSFETs Q14, Q16 and Q18, Q20.

The Y address decoder YDCR consists of mutually similar NAND gate circuits G3, G4, etc. The internal complementary address signals formed by the Y address buffer YADB for receiving the Y external address signals AY consisting of a plurality of bits are applied in a predetermined combination to these NAND gate circuits G3, G4, etc. The internal activation pulse $\phi_{wc}$ outputted through the OR gate circuit G6 is commonly supplied to the NAND gate circuits G3, G4, etc.

In this embodiment the common complementary data lines CD, $\overline{CD}$ are provided with P-channel type load (pull-up) MOSFETs Q21 and Q22 in order to accomplish a high speed write recovery operation when the internal write signal WE is supplied to their gate and thus to speed up the write operation, though the invention is not particularly limited to this circuit arrangement.

The common complementary data lines CD, $\overline{CD}$ are connected to the input terminal of the read circuit RA and the output terminal of the write circuit WA. The read circuit RA supplies the read signal to the data output terminal $D_{out}$ and the write data signal supplied from the data input terminal $D_{in}$ is supplied to the input terminal of the write circuit WA.

The timing control circuit TC receives the control signals from the external terminals $\overline{WE}$, $\overline{CS}$ and generates the internal control timing signals $\phi_r$, $\phi_{wr}$ and WE.

The read circuit RA includes a sense amplifier and an output circuit, and receives the control signal $\phi_r$ supplied from the control circuit TC and internal activation pulse $\phi_{wc}$. As noted above, read circuit RA includes a sense amplifier and exhibits a high sensitivity sensing operation.

Figure 5:
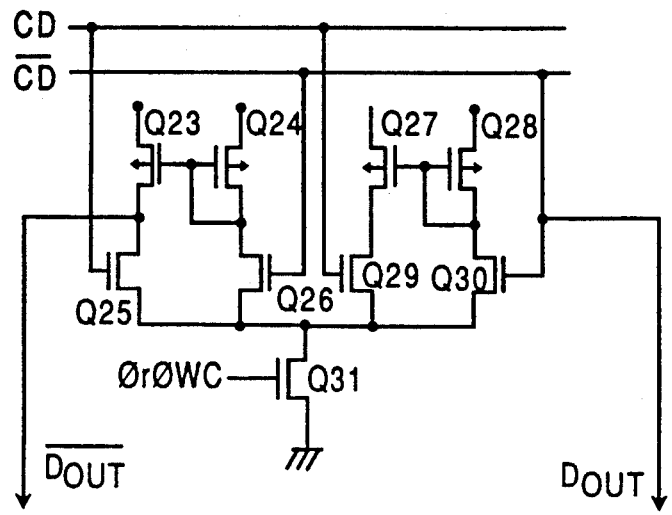
FIG. 5 is a circuit diagram showing in detail a sense amplifier circuit that can be used for the read circuit in FIG. 2.

FIG. 5 is a circuit diagram showing the sense amplifier of the read circuit RA of FIG. 2. The sense amplifier can consist of two differential amplifiers formed with MOSFETs Q23–Q26 and Q27–Q30. The gates of input MOSFETs Q25, Q26 and Q30, Q29 are connected to the common complementary data lines CD, $\overline{CD}$, respectively. A constant current source MOSFET Q31 is connected to both differential amplifiers in common, and the internal activation pulse $\phi_r \cdot \phi_{wc}$ is supplied to the gate of the constant current source MOSFET Q31 so that the sense amplifier performs the amplification operation for a predetermined period of time in a read operation. When rendered operative, the sense amplifier amplifies differentially the data signals supplied to the common complementary data lines CD and $\overline{CD}$, and amplified data signals are supplied to a latch circuit (not shown in the figure) through complementary output lines $D_{out}$, $\overline{D_{out}}$. The latch circuit latches the data signals and outputs to the data output terminal $D_{out}$ (see FIG. 2). When rendered inoperative, the output terminal $D_{out}$ of the read circuit RA is set to the high impedance state or to the floating state.

The operation of the write circuit WA of FIG. 2 is controlled by the typical control signal $\phi_{wr}$. When rendered operative, the write circuit WA outputs the complementary data signals corresponding to the input data supplied to the data input terminal $D_{in}$ to the common complementary data lines CD, $\overline{CD}$. When the write circuit WA is rendered inoperative, its pair of output terminals are set to the high impedance state or to the floating state.

It is also possible to dispose equalizing MOSFETs between the pairs of complementary data lines D0, $\overline{D0}$, between D1 and $\overline{D1}$ and/or between the common complementary data lines CD, $\overline{CD}$, though this arrangement is not particularly limitative. Upon receiving the change detection signal $\phi_c$ of the address signal, etc., these equalizing MOSFETs short-circuit temporarily the complementary data lines and/or common complementary data lines to make their potential equal to one another.

Figure 3:
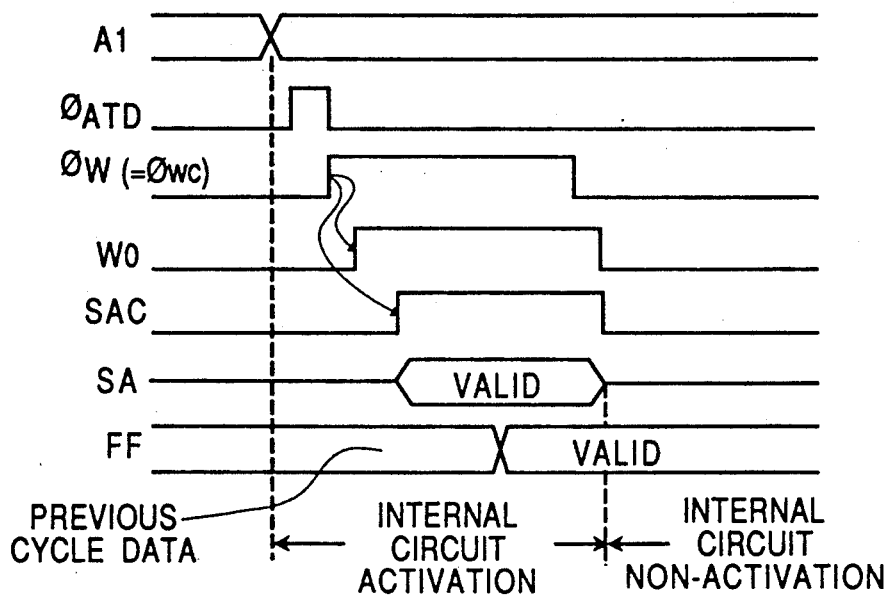
FIG. 3 is a timing chart useful for explaining one example of the ordinary operation mode of the static RAM of the present invention.

FIG. 3 is a timing chart useful for explaining an example of the read operation in the ordinary mode. When the chip select signal $\overline{CS}$, not shown, is at the low level and any one of the address signals Ai changes due to the supply of the address signal for the memory access, the address signal change detection circuit ATDi operates in response thereto and generates the address signal change detection pulse $\phi_{ATD}$. This pulse $\phi_{ATD}$ is transferred to the internal activation pulse generation circuit WPG through the OR gate circuit G5. The internal activation pulse generation circuit WPG generates the activation pulse $\phi_w$ having a pulse width which is matched with the predetermined read completion time of the memory data of the memory cells. In the ordinary mode such as described above, the power source voltage $V_{cc}$ is about 5 V and the control signal TM is at the low level (logic "0"), although the invention is not limited to this. Therefore, the activation pulse $\phi_w$ is essentially the same as the internal activation pulse $\phi_{wc}$, and is transferred to the decoders XDCR, YDCR and the sense amplifier SA. Therefore, the selected word line W0 is set to the high level selection state for the time corresponding to the pulse width of the activation pulse $\phi_{wc}$ (which, in normal operation, corresponds to the pulse $\phi_w$). Similarly, the switch MOSFETs constituting the column switch CW selected by the Y decoder YDCR are turned ON for the same period. The sense amplifier SA, too, is activated for the time corresponding to the pulse width of the activation pulse $\phi_{wc}$. It should be noted that, in practice, the memory information of the memory cell is transferred to the sense amplifier after the above-mentioned word line selection operation and the selection operation of the complementary data lines is made so that the amplification start timing of the sense amplifier is delayed in the manner shown in the drawing.

The amplification output of the sense amplifier is latched by the latch circuit FF and, in the former half of the memory cycle, the data lines of the previous cycle are kept as such.

In this embodiment the selection operation of the word lines and the complementary data lines is conducted for a predetermined period by the internal activation pulse $\phi_{wc}$. Accordingly, the current flowing from the complementary data lines to a large number of memory cells connected to the selected word line can be reduced to the minimum necessary level so that low power consumption can be attained. Since the sense amplifier for amplifying the relatively small memory information with high sensitivity consumes the current only for the necessary period, low consumption can be accomplished too. This operation is known as an automatic power-down operation since the pulse $\phi_w$ from the pulse circuit WPG serves to power down the word line and the sense amplifier operation when $\phi_w$ returns to its low level.

Figure 4:
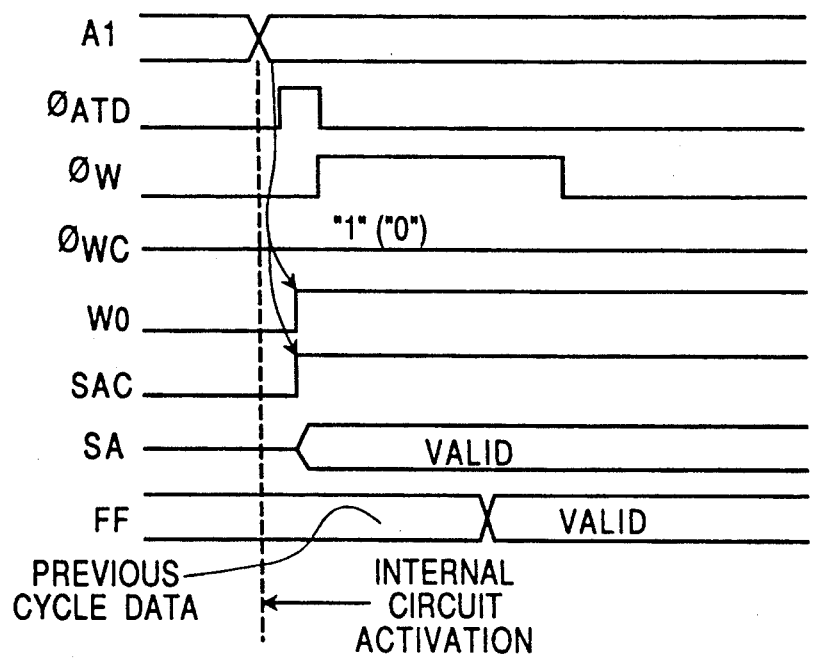
FIG. 4 is a timing chart useful for explaining one example of a test mode in accordance with the present invention.

FIG. 4 is a timing chart for explaining an example of the acceleration test operation mode such as aging.

By way of example, the source voltage $V_{cc}$ is set to a relatively high voltage value such as about 8 V in the acceleration test such as aging. Under this state, if the chip select signal $\overline{CS}$ is set to the low level and any one of the address signals Ai changes due to the supply of the address signal for memory access, the address signal change detection circuit ATDi operates in response thereto and generates the address signal change detection pulse $\phi_{ATD}$. This detection pulse $\phi_{ATD}$ is transferred to the internal activation pulse generation circuit WPG through the OR gate circuit G5. As in the case of ordinary operation, the internal activation pulse generation circuit WPG generates the activation pulse $\phi_w$ having the pulse width which is matched with the predetermined read completion time of the memory information of the memory cell in the same way as described already. However, in the test mode such as described above, the power source voltage is about 8 V and the control signal TM is at the high level (logic "1"). This means that $\phi_{wc}$ will have a constant high level (e.g. logic "1") for as long as TM is high. Therefore, the activation pulse $\phi_w$ described above is overridden, and, therefore, effectively invalidated (i.e., it does not correspond to $\phi_{wc}$), and the decoders XDCR, YDCR and the sense amplifier SA are rendered steadily operative. Preferably, this will last for a whole period of an operating cycle of the memory. Accordingly, in the memory access period in which the chip select signal $\overline{CS}$ is at the low level, any one of the word lines will always be selected and a pair of complementary data lines are selected and coupled to the common complementary data lines. In the modes other than the write mode, the sense amplifier is rendered operative. As a result, the D.C. current from the complementary data lines is caused to flow through the memory cells connected to the selected word line, and the read circuit RA such as the sense amplifier, too, becomes operative so that the aging time described above can be made shorter.

The action and effect brought forth by the embodiment described above is as follows.

(1) In the acceleration test mode such as aging, the internal activation pulse $\phi_w$ formed on the basis of the address signal change detection pulse is substantially invalidated. Accordingly, since the selection state of the word lines and the complementary data lines and the operation state of the sense amplifier can be continued, the acceleration test time such as aging can be shortened while attaining low power consumption in the ordinary mode (where $\phi_w$ is not invalidated).

(2) The circuit for substantially invalidating the internal activation pulse $\phi_w$ is one that detects the rise of the power source voltage $V_{cc}$ to a predetermined high voltage. Therefore, since the test mode can be set automatically by utilizing the operation voltage at the time of the acceleration test such as aging, the increase in the number of external terminals and control signals can be restricted.

Although the present invention completed by the present inventors has thus been described definitely with reference to the embodiments thereof, the invention is not particularly limited thereto but can of course be changed or modified in various ways without departing from the spirit and scope thereof. For example, the test mode can be set by various methods such as the disposition of test mode setting terminals, the combination of the chip select signals, the write enable signal and the input/output terminals $D_{in}$, $D_{out}$ and the like, besides the method described above which sets the power source voltage to the high voltage. The circuit construction for controlling the selection operation of the word lines in accordance with the internal activation pulse may employ a structure which controls the operation of the driving circuit, besides the method described above which uses the address decoder. In this manner, means for controlling the activation of the internal circuit may assume various forms.

Figure 6:
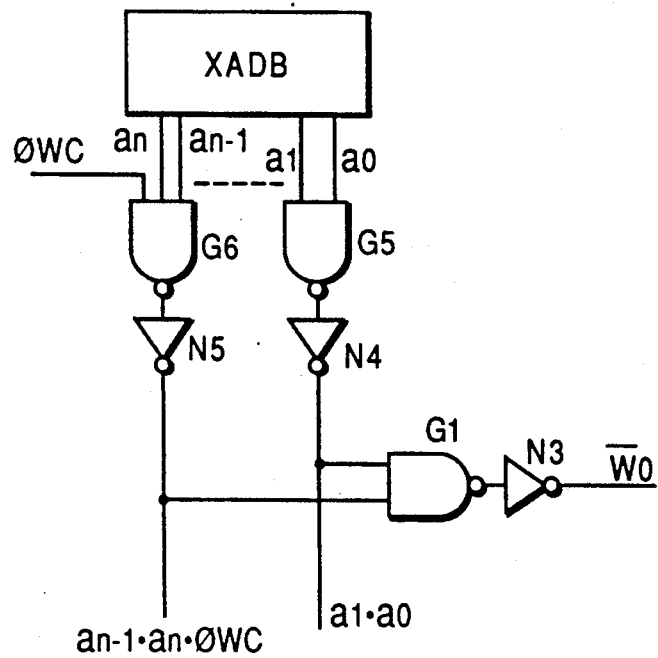
FIG. 6 is a circuit diagram showing an alternative embodiment of an address decoder circuit that can be used in the present invention.

FIG. 6 shows another embodiment of an X address decoder circuit XDCR. The internal address signals a0, $a_1 \ldots a_n$ supplied from the X address buffer XADB are predecoded by the AND gates G5, G6, etc., in order to reduce the number of address signal lines fed to X decoder circuit XDCR. The AND gate G5 generates a predecoded signal $a_1 \cdot a_0$ and transfers it to decoder circuits such as the NAND gate G1. The NAND gate G6 generates another predecoded signal $a_{n-1} \cdot a_n \cdot \phi_{wc}$ which includes the internal activation signal $\phi_{wc}$. Thus, the NAND gate G1 outputs a word line selection signal to the word line W0 through a driver circuit N3 for a predetermined period of time in accordance with the internal activation pulse signal $\phi_{wc}$. Besides the use of the OR gate circuit such as described above, means for invalidating the supply of the internal activation pulse $\phi_w$ may be circuits that use other logic gate circuits or switches.

Figure 7A:
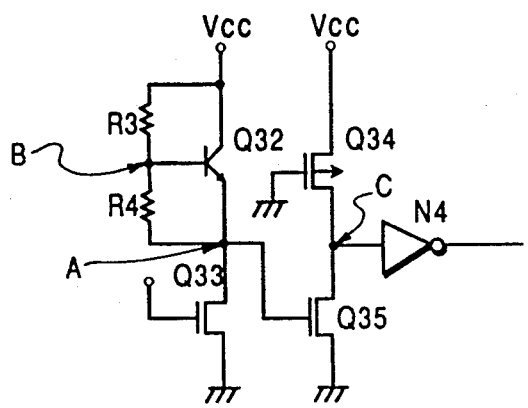
FIGS. 7a and 7b and 8a and 8b are circuit diagrams showing alternative embodiments of a voltage detection circuit that can be used in the present invention.

The high voltage detection circuit to detect a test mode can be changed or modified in various manners. FIG. 7A is a circuit diagram showing another embodiment of a voltage detection circuit which can be used in the present invention, and FIG. 7B is a diagram showing aspects of the operation of the circuit of 7A.

Figure 7B:
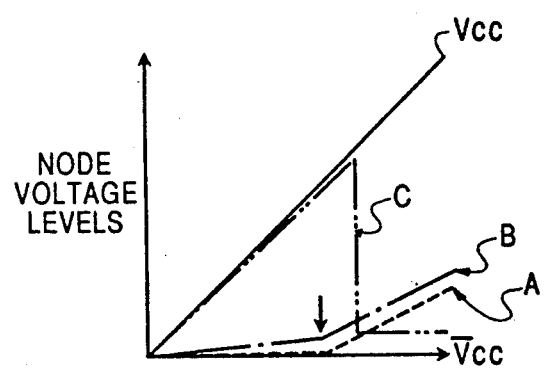

Referring to FIGS. 7A and 7B, a voltage level node is increased corresponding to an increase of $V_{cc}$ when a voltage difference between nodes and , i.e. a voltage difference between a base and an emitter of bipolar transistor Q32, is over a threshold voltage of transistor Q32, transistor Q32 turns ON and the voltage level begins increasing.

When the voltage level of node is higher than a threshold voltage of transistor Q35, a voltage level of node becomes a low level. Inverter N4 will then give a high level output to indicate that $V_{cc}$ has increased above a predetermined level.

Figure 8A:
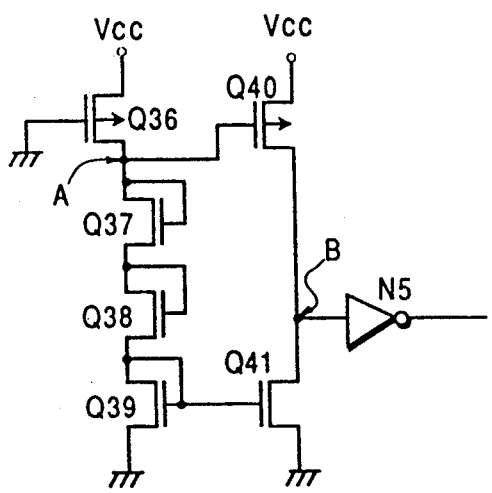
Figure 8B:
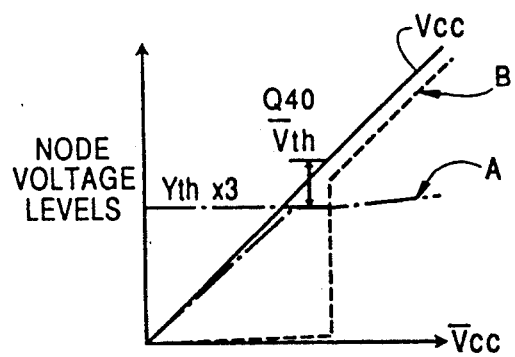

FIGS. 8A and 8B show another embodiment for detecting a high voltage test mode state. Transistors Q37, Q38 and Q39 clamp a voltage level of node at $V_{th}Q37 + V_{th}Q38 + V_{th}Q39$.

When a voltage difference between $V_{cc}$ and the voltage level of node is over the $V_{th}Q40$, transistor Q40 becomes the ON state to indicate that $V_{cc}$ has increased above a predetermined level.

The number of transistors connected in series (Q37, Q38, Q39) is designed to control the voltage which activates the transistor Q40.

The load means in the static memory cell may be of a complete static type using the P-channel MOSFETs whose current supply capacity is set to a low level, besides the means using high resistance polysilicon described above. Besides the means described above which uses two MOSFETs, the load means disposed in the complementary data lines of the memory array may consist of only one MOSFET. In this manner, the structure of the memory array and definite circuit construction of its peripheral circuits can take various forms. For example, the peripheral circuit may consist of the combination of a CMOS circuit and bipolar transistors.

This invention can be used widely for static RAMs and may be incorporated, for example, in various digital integrated circuits such as a 1-chip microcomputer.

In summary, a major advantage of the present invention is the fact that in an acceleration test mode such as aging, an internal activation pulse formed on the basis of the change detection pulse of the address signal is substantially invalidated so that the selection state of the word lines and complementary data lines and the operation state of the sense amplifier can be continued. Accordingly, the acceleration test time such as aging can be shortened while accomplishing low power consumption in the ordinary mode.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor memory device comprising:
   a plurality of memory cells each respectively coupled to a word line and to a pair of data lines;
   read means selectively coupled to said pair of data lines through a switching means for amplifying data from said memory cells;
   address transition detecting means for outputting a pulse signal in response to changes in an address signal applied to said semiconductor memory device;
   pulse generating means for outputting a first control signal having a predetermined pulse width in response to said pulse signal;
   operation mode detection means for detecting a predetermined operation mode in accordance with a voltage level of a predetermined external terminal and for outputting a second control signal when said predetermined operation mode is detected;
   control means for receiving said first control signal and said second control signal, wherein said control means includes means for outputting a third control signal; and
   first selection means coupled to receive said third control signal and said address signal for selecting a predetermined word line in accordance with said address signal and for activating the selected word line in response to said third control signal,
   wherein said outputting means of said control means outputs said third control signal having a predetermined pulse width in response to said first control signal when said operation mode detection means does not detect said predetermined operation mode, and outputs the third control signal in response to said second control signal so that the third control signal is outputted for a period of time longer than said predetermined pulse width when said operation mode detection means detects said predetermined operation mode.

2. A semiconductor memory device according to claim 1, wherein said outputting means includes means for outputting said third output for substantially a whole period of an operation cycle of the semiconductor memory device.

3. A semiconductor memory device according to claim 2, wherein said predetermined operation mode is an aging mode during which a predetermined voltage greater than a normal operating voltage of the semiconductor memory device is applied to said external terminal.

4. A semiconductor memory device according to claim 1, further comprising:
   second selection means receiving said third control signal supplied from said control means for selectively coupling a predetermined one pair of said data lines to said read means,
   wherein said read means further includes a sense amplifier which is activated in response to said third control signal.

5. A semiconductor memory device according to claim 4, wherein said semiconductor memory device includes means for carrying out a normal read operation using a predetermined power source voltage when said predetermined operation mode is not detected, and wherein said operation mode detection means further includes a high voltage detection circuit coupled to said predetermined external terminal to detect a higher voltage than a power source voltage supplied to the memory device during said predetermined operation mode.

6. A semiconductor memory device according to claim 5, wherein said predetermined external terminal is a power source pin of the memory device.

7. A semiconductor memory device according to claim 5, wherein said predetermined external terminal is a pin for setting a test mode as said predetermined operation mode.

8. A semiconductor memory device according to claim 5, wherein said high voltage detection circuit includes a plurality of MOSFETs connected in series between a power source voltage level and a ground level and an inverter connected to a connection point of said MOSFETs.

9. A semiconductor memory device according to claim 8, wherein a gate of said each MOSFET is connected to a drain of the MOSFET.

10. A semiconductor memory device according to calim 5, wherein said first selection means includes a plurality of decoder circuits and wherein each said decoder circuit receives said third control signal.

11. A semiconductor memory device according to claim 10, wherein said decoder circuit receives said third control signal and said address signal as a logically combined signal.

12. A semiconductor memory device according to claim 5, wherein said first selection means includes a plurality of predecoder circuits and a plurality of driver circuits respectively coupled to a decoder circuit and to said word line, and wherein one of said driver circuits activates said selected word line in response to said third control signal.

13. A semiconductor memory device according to claim 4, wherein said each memory cell includes two inverter circuits which each have an input terminal connected to an output terminal of the other inverter circuit.

14. A semiconductor memory device according to claim 13, wherein said inverter circuits each include a polysilicon resistance and a MOSFET connected in series between a power source voltage level and a ground level.

15. A semiconductor memory device according to claim 1, wherein said predetermined operation mode is an aging mode during which a predetermined voltage greater than a normal operating voltage of the semiconductor memory device is applied to said external terminal.

16. An operation method of a semiconductor memory device comprising the steps of:
   detecting a transition of an address signal supplied to an address terminal of the device and outputting a pulse signal;
   generating a first control signal having a predetermined pulse width in response to said pulse signal;
   detecting a voltage level supplied to a predetermined external terminal in order to detect a predetermined operation mode, and outputting a second control signal when said predetermined operation mode is detected;
   generating a third control signal having a predetermined pulse width in response to said first control signal when said predetermined operation mode is not detected and generating the third control signal having a pulse width longer than said predetermined pulse width in response to said second control signal when said predetermined operation mode is detected;
   selecting a word line connected to a plurality of memory cells in accordance with said address signal and activating the selected word line in response to said third control signal;
   selecting a pair of data lines connected to a plurality of memory cells and coupling the selected pair of data lines to a pair of common data lines; and
   amplifying data supplied from a memory cell coupled to said selected word line and said selected pair of data lines through the pair of data lines and said pair of common data lines during a period when said third control signal is generated.

17. An operation method according to claim 16, wherein said third control signal is generated for substantially a whole operation cycle of the memory device when said predetermined operation mode is detected.

18. An operation method according to claim 17, wherein said predetermined operation mode is an aging mode during which a predetermined voltage greater than a normal operating voltage of the semiconductor memory device is applied to said external terminal.

19. An operation method according to claim 16, wherein said predetermined operation mode is an aging mode during which a predetermined voltage greater than a normal operating voltage of the semicondcutor memory device is applied to said external terminal.

20. An automatic power-down random access memory (RAM) comprising:
   a memory array including a plurality of memory cells for storing information;
   means for selecting predetermined memory cells in said memory array in response to externally applied address signals;
   sense amplifier means for amplifying data read out from a memory cell selected in said selecting means in accordance with said address signals;
   automatic power-down means for operating said selecting means and said sense amplifier means only for a predetermined time shorter than an operation cycle of said RAM during a normal operating mode;
   means for detecting a predetermined mode other than said normal operating mode; and
   means for overriding said automatic power-down means when said predetermined mode is detected so that said selecting means and said sense amplifier means will operate for a period of time longer than said predetermined time in response to said address signals during said predetermined mode.

21. An automatic power-down RAM according to claim 20, wherein said predetermined mode is a test mode.

22. An automatic power-down RAM according to claim 21, wherein said test mode is an aging mode.

23. An automatic power-down RAM according to claim 22, wherein said aging mode includes means for applying a voltage to said RAM higher than a normal operating power supply voltage of the RAM, and wherein said detecting means includes means for detecting said higher voltage of said aging mode.

24. An automatic power-down RAM according to claim 20, wherein said detecting means comprises means for detecting said predetermined mode by detecting a predetermined voltage associated with said predetermined mode, wherein said predetermined voltage is higher than a normal power supply operating voltage of said RAM.

* * * * *